(12) United States Patent
Noemaun et al.

(10) Patent No.: US 11,848,048 B2
(45) Date of Patent: Dec. 19, 2023

(54) MEMORY DEVICE DECODER CONFIGURATIONS

(71) Applicant: Micron Technology, Inc., Boise, ID (US)

(72) Inventors: Ahmed Nayaz Noemaun, Boise, ID (US); Chandra S. Danana, Boise, ID (US); Durga P. Panda, Boise, ID (US); Luca Laurin, Lissone (IT); Michael J. Irwin, Boise, ID (US); Rekha Chithra Thomas, Hyderabad (IN); Sara Vigano, Monza (IT); Stephen W. Russell, Boise, ID (US); Zia A. Shafi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 192 days.

(21) Appl. No.: 17/456,968

(22) Filed: Nov. 30, 2021

(65) Prior Publication Data

US 2023/0170015 A1    Jun. 1, 2023

(51) Int. Cl.
*G11C 11/00* (2006.01)
*G11C 13/00* (2006.01)
*H01L 29/423* (2006.01)
*H10B 63/00* (2023.01)

(52) U.S. Cl.
CPC ...... *G11C 13/0023* (2013.01); *G11C 13/0004* (2013.01); *H01L 29/4236* (2013.01); *H01L 29/42376* (2013.01); *H10B 63/84* (2023.02); *G11C 2213/71* (2013.01)

(58) Field of Classification Search
CPC ............ G11C 13/0023; G11C 13/0004; G11C 2213/71; H10B 63/84; H01L 29/4235; H01L 29/42376
USPC ......................................................... 365/163
See application file for complete search history.

(56) References Cited

U.S. PATENT DOCUMENTS

| | | | |
|---|---|---|---|
| 6,597,037 B1 * | 7/2003 | Forbes | G11C 8/10 257/302 |
| 6,900,495 B2 * | 5/2005 | Hofmann | H10B 12/053 257/302 |
| 6,979,857 B2 * | 12/2005 | Forbes | H10B 69/00 257/317 |
| 7,157,771 B2 * | 1/2007 | Forbes | H01L 29/66825 257/411 |
| 7,241,654 B2 * | 7/2007 | Forbes | H10B 69/00 438/270 |
| 7,935,595 B2 * | 5/2011 | Shiratake | H10B 12/09 438/257 |

(Continued)

*Primary Examiner* — Viet Q Nguyen
(74) *Attorney, Agent, or Firm* — Holland & Hart LLP

(57) ABSTRACT

Methods, systems, and devices for memory device decoder configurations are described. A memory device may include an array of memory cells and decoder circuits. The array may include one or more memory cells coupled with an access line, and a decoder circuit may be configured to bias the access line to one or more voltages. The decoder circuit may include a first transistor coupled with the access line and a second transistor coupled with the access line. The first transistor may be a planar transistor having a first gate electrode formed on a substrate, and the second transistor may be a trench transistor having a second gate electrode that extends into a cavity of the substrate, where a length of a first gate electrode may be greater than a length of the second gate electrode.

24 Claims, 7 Drawing Sheets

(56) References Cited

U.S. PATENT DOCUMENTS

| | | | | |
|---|---|---|---|---|
| 7,977,736 B2* | 7/2011 | Kim | ...................... | H01L 27/092 |
| | | | | 257/329 |
| 8,174,065 B2* | 5/2012 | Kim | .................. | H01L 29/66666 |
| | | | | 438/242 |
| 8,189,376 B2* | 5/2012 | Koldiaev | ............... | H10B 12/05 |
| | | | | 365/72 |
| 8,455,319 B2* | 6/2013 | Lee | ........................ | H10B 12/20 |
| | | | | 438/270 |
| 10,134,756 B2* | 11/2018 | Shim | ...................... | H10B 43/50 |
| 10,311,945 B2* | 6/2019 | Masuoka | ............... | H10B 10/18 |
| 10,910,039 B2* | 2/2021 | Masuoka | .............. | G11C 11/418 |

* cited by examiner

MEMORY DEVICE DECODER CONFIGURATIONS

FIELD OF TECHNOLOGY

The following relates generally to one or more systems for memory and more specifically to memory device decoder configurations.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
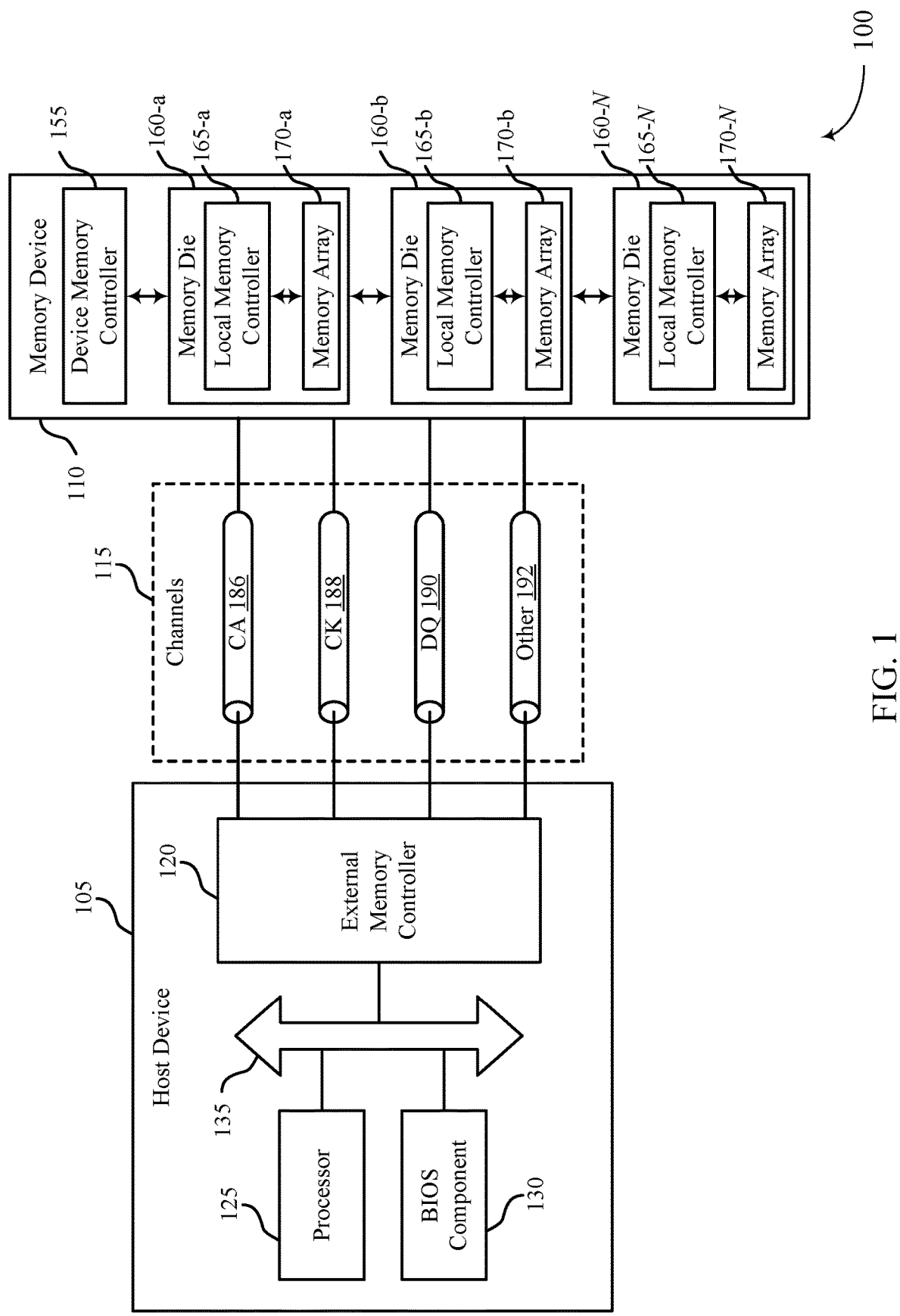
FIG. 1 illustrates an example of a system that supports memory device decoder configurations in accordance with examples as disclosed herein.

Memory devices may include arrays of memory cells and supporting circuitry for operating and accessing the memory cells. For example, a memory device may include decoder circuits coupled with access lines and configured to bias the access lines to various voltages in order to access corresponding memory cells. For instance, a memory cell (e.g., a cross-point memory cell or some other types of memory cells) may be coupled with a word line and a bit line (e.g., a digit line) that may be biased by decoder circuits to apply a voltage differential across the memory cell and access (e.g., read data from, write data to) the memory cell. In some examples, decoder circuits and other supporting circuits may be located (e.g., directly) under corresponding memory cells and may be designed to occupy a footprint corresponding to a respective memory cell pitch. As memory cell size scales (e.g., is reduced), corresponding decoder circuits may also scale (e.g., be reduced) so that a size (e.g., an area) of a memory die including an array of memory cells and the decoder circuits may correspond to (e.g., be the same as) a size of the array of memory cells.

In some cases, however, scaling the decoding circuits and other supporting circuits that support the memory cell may present different challenges than scaling the components of the memory cells. For example, a decoding circuit may be configured to apply a voltage differential across a memory cell to access the memory cell. The types of components used to apply the voltage differential may not scale in equal portions with the components of the memory cells. That is, as the memory cell size scales down, decoder circuits may bias the access lines to relatively similar (e.g., same) operating voltages in order to access memory cells rather than scaled down operating voltages, which may constrain the scaling of the decoder circuits. For example, in some cases, transistors included in a decoder circuit may suffer performance degradation (e.g., increased power consumption, increased current leakage, etc.) as the transistor get small and may be unable to support biasing an access line to corresponding operating voltages as the size of the transistors of the decoder circuit decreases is reduced. Accordingly, decoder circuit scaling, and thus memory die scaling, may be limited.

In accordance with examples as described herein, a memory device may include a decoder circuit that is scalable with reduced memory cell size while supporting corresponding operating voltages. For example, the memory device may include an array of memory cells and one or more decoder circuits coupled with the array of memory cells. For instance, the array of memory cells may include one or more memory cells coupled with an access line (e.g., a word line, a bit line), and a decoder circuit may be coupled with and configured to bias the access line to one or more voltages (e.g., operating voltages of the one or more memory cells). The decoder circuit may include a pair of transistors including a first transistor coupled with the access line and a first voltage source and a second transistor coupled with the access line and a second voltage source. The first transistor may be a planar transistor having a first gate electrode formed on a substrate, and the second transistor may be a trench transistor having a second gate electrode that extends into a cavity of the substrate. By including the second transistor, the decoder circuit may be scaled down (e.g., reduced in area) while supporting biasing the access line to the one or more voltages. For example, a length of the second gate electrode may be less than a length of the first gate electrode (e.g., in a drain to source direction of the transistors) based on a portion of the second gate electrode extending into the cavity. Thus, an overall length of the decoder circuit may be reduced in accordance with memory cell scaling.

In some examples, one or more aspects (e.g., components) of the second transistor may be asymmetrical to support improved performance of the decoder circuit. For example, the second gate electrode may include a first portion that extends into the cavity and a second portion that asymmetrically overlays an opening of the cavity (e.g., extends more towards a drain electrode of the second transistor than a source electrode of the second transistor). Additionally, or alternatively, the second transistor may include asymmetrical spacers that insulate the second gate electrode from the source electrode and the drain electrode. Additionally, or alternatively, distances between the second gate electrode and the source and drain electrodes may be asymmetrical. For example, the second gate electrode may be located (e.g., formed) closer to the source electrode than the drain electrode. The one or more asymmetrical aspects of the second transistor may reduce a leakage current (e.g., a gate induced drain leakage (GIDL)) associated with operating the second transistor, thereby reducing power consumption and increasing biasing accuracy.

Features of the disclosure are initially described in the context of memory systems, dies, and arrays as described with reference to FIGS. 1-4. Features of the disclosure are additionally described in the context of top plan diagrams and side elevation diagrams as described with reference to FIGS. 5A, 5B, 6A, 6B, 7A, and 7B.

FIG. 1 illustrates an example of a system 100 that supports memory device decoder configurations in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In order to support scaling of the memory device 110 (e.g., of memory dies 160 included in the memory device 110), the memory device 110 may include decoders (e.g., included in local memory controllers 165) that may be scaled down to occupy (e.g., and not exceed) a reduced footprint associated with scaled down memory cells of memory arrays 170 while mitigating (e.g., reducing) performance degradation associated with reduced decoder size. For example, a local memory controller 165 may include a decoder (e.g., multiple decoders) that includes a planar transistor and a trench transistor coupled to each other. The planar transistor may include a first gate electrode formed on a substrate, a first drain electrode, and a first source electrode, and the trench transistor may include a second gate electrode formed on the substrate and extending into a cavity of the substrate, a second drain electrode, and a second source electrode. In some cases, the first source electrode and the second drain electrode may be a same electrode (e.g., a shared electrode between the planar transistor and the trench transistor). A length of the second gate electrode may be less than a length of the first gate electrode (e.g., in a drain electrode to source electrode direction), for example, based on the second drain electrode extending into the cavity. Thus, a total length (e.g., pitch) of the decoder (e.g., a combined length of the planar transistor and the trench transistor) may be reduced in accordance with memory cell scaling. In some examples, one or more aspects (e.g., components) of the trench transistor may be asymmetrical.

Figure 2:
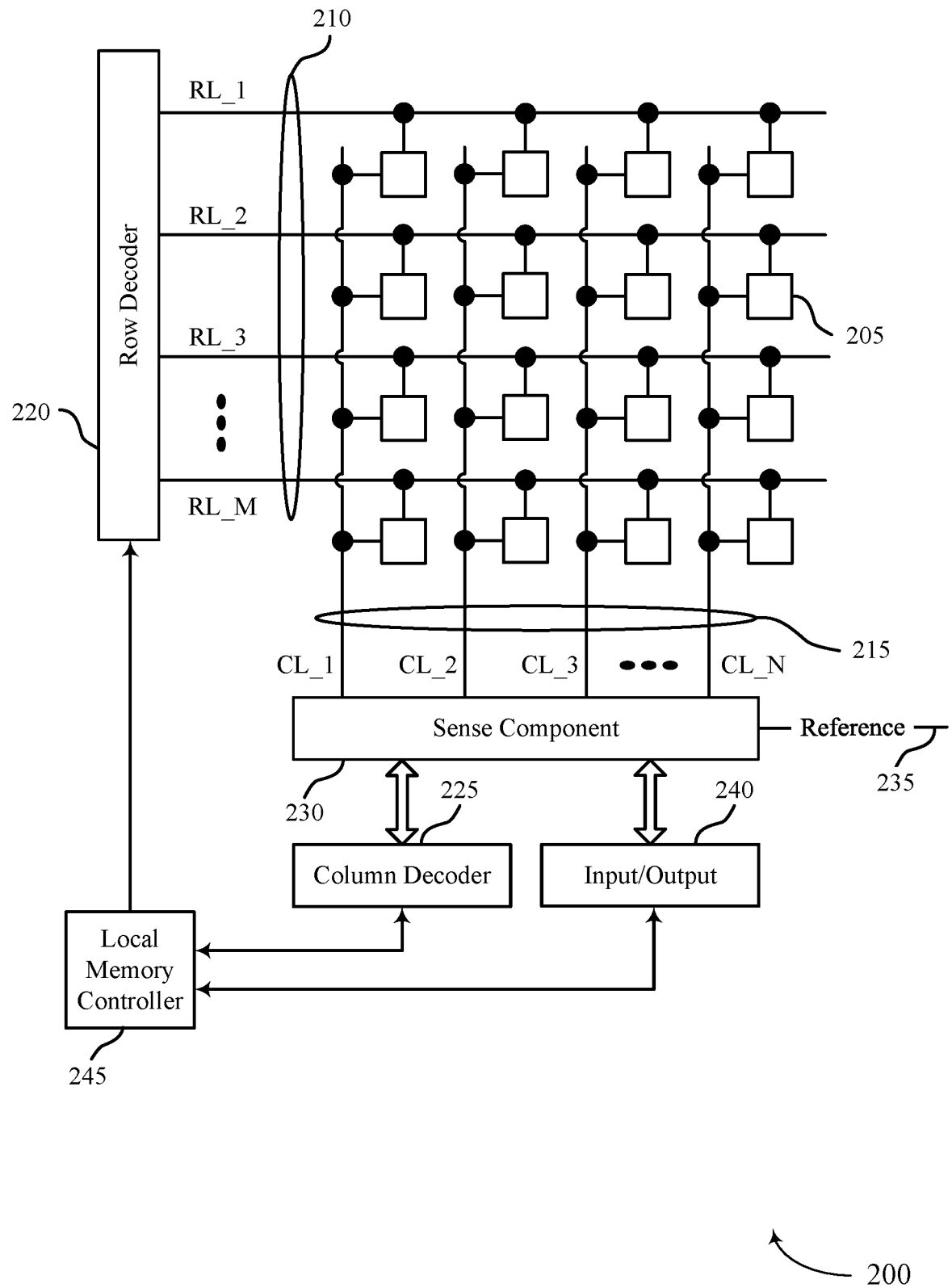
FIG. 2 illustrates an example of a memory die that supports memory device decoder configurations in accordance with examples as disclosed herein.

FIG. 2 illustrates an example of a memory die 200 that supports memory device decoder configurations in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

A row decoder 220, a column decoder 225, or both, may include one or more pairs of transistors used to activate a given access line. Each pair of transistors may support scaling of the row decoder 220, the column decoder 225, or both, while supporting activating an access line in accordance with operating voltages of the memory cells 205. For example, a pair of transistors may include a planar transistor and a trench transistor (e.g., coupled to each other). The planar transistor may include a first gate electrode formed on a substrate, and the trench transistor may include a second gate electrode formed on the substrate and extending into a cavity of the substrate. A length of the second gate electrode may be less than a length of the first gate electrode (e.g., in a drain electrode to source electrode direction), for example, based on the second drain electrode extending into the cavity. Thus, a total length (e.g., pitch) of the decoder (e.g., a combined length of the planar transistor and the trench transistor) may be reduced in accordance with memory cell scaling. In some examples, one or more aspects (e.g., components) of the trench transistor may be asymmetrical.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

Figure 3:
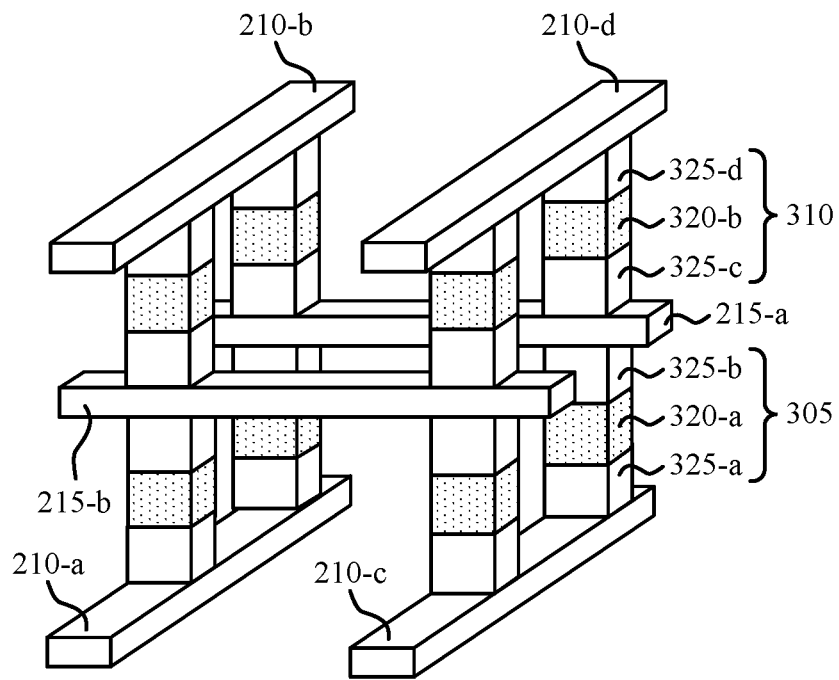
FIG. 3 illustrates an example of memory cells that support memory device decoder configurations in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-*a*, a row line 210-*b*, a row line 210-*c*, a row line 210-*d*, a column line 215-*a*, and a column line 215-*b*, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or similar, in an effort to increase visibility and clarity of the depicted features.

One or more memory cells of the first deck 305 may include one or more of an electrode 325-*a*, a storage element 320-*a*, or an electrode 325-*b*. One or more memory cells of the second deck 310 may include an electrode 325-*c*, a storage element 320-*b*, and an electrode 325-*d*. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-*c* of the second deck 310 and the second electrode 325-*b* of the first deck 305 may be coupled with column line 215-*a* such that the column line 215-*a* may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 325-*a*, storage element 320-*a*, electrode 325-*b*), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320. In some cases, a portion of a storage element may undergo a material change associated with the logic states.

In some examples, programming pulses may be applied to a storage element 320 by biasing a corresponding row line 210 and column line 215 using one or more decoder circuits coupled with the row line 210 and the column line 215. To support reduced memory cell scaling, the one or more decoder circuits may be hybrid decoders that include a planar transistor and a trench transistor used to bias an access line (e.g., a row line 210, a column line 215) coupled with the decoder circuit, where the trench transistor may have a first length that is less than a second length of the planar transistor, and, in some examples, one or more aspects (e.g., components) of the trench transistor may be asymmetrical.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have an high threshold voltage state and a low threshold voltage state. An high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but may not be in a pillar or stack configuration).

Figure 4:
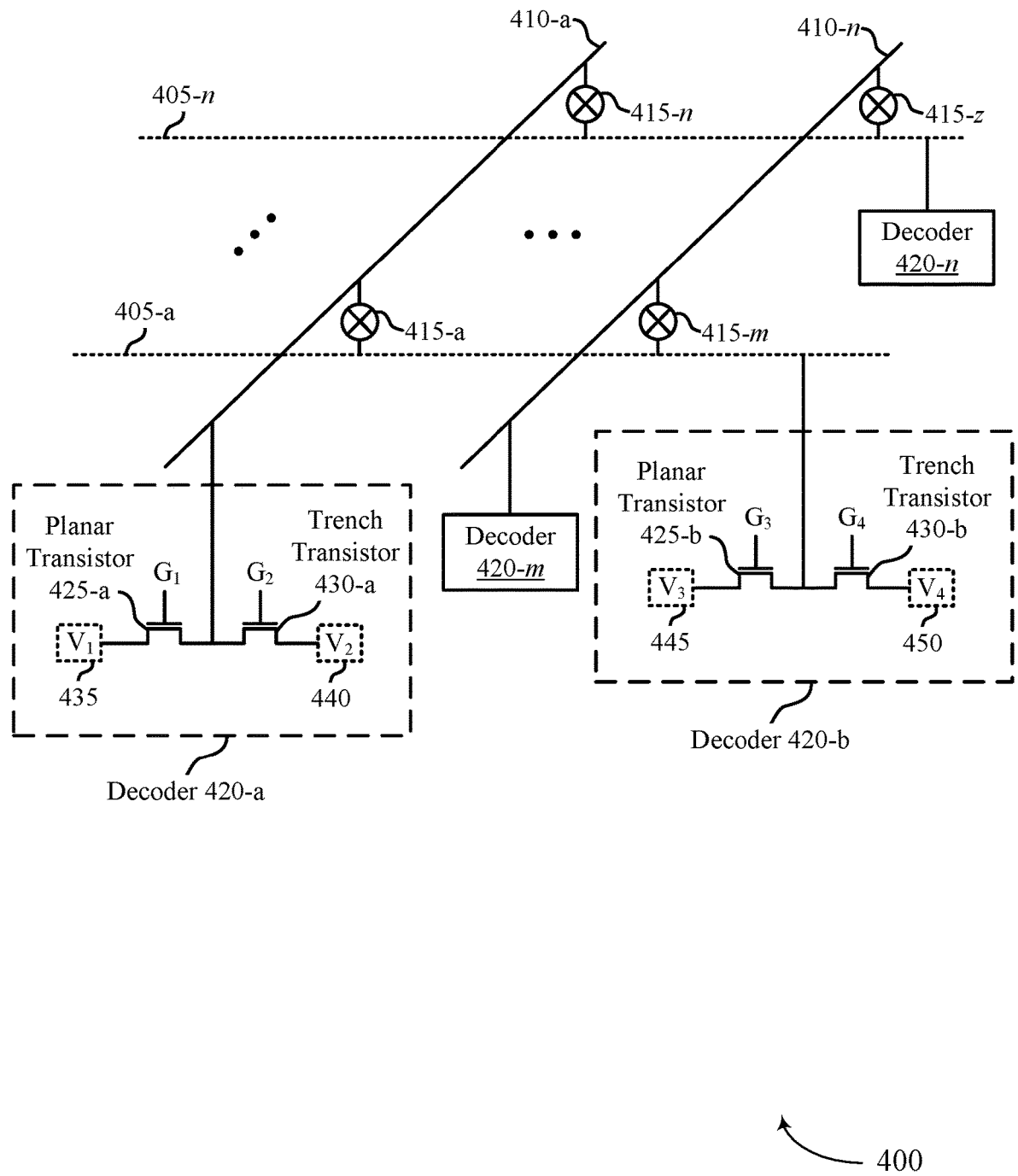
FIG. 4 illustrates an example of a memory die that supports memory device decoder configurations in accordance with examples as disclosed herein.

FIG. 4 illustrates an example of a memory die 400 that supports memory device decoder configurations in accordance with examples as disclosed herein. The memory die 400 may be an example of a memory die 160 or 200 described with reference to FIGS. 1 and 2, respectively. For example, the memory die 400 may include memory cells 415, which may be examples of memory cells 205 described with reference to FIG. 2. Additionally, the memory die 400 may include word lines 405 and bits lines 410, which may be examples of row lines 210 and column lines 215, respectively, described with reference to FIGS. 2 and 3.

The memory cells 415 may be located at intersections of word line 405 and columns lines 410. For example, the memory die 400 may include word line 405-a through word line 405-n that extend in a first direction and bit line 410-a through bit line 410-n that extend in a second direction. The word lines 405 and the bit lines 410 may be arranged in a pattern (e.g., a grid-like pattern) such that a single bit line 410 intersects (e.g., crosses) each of the word lines 405 and a single word line 405 intersects (e.g., crosses) each of the bit lines 410, and a memory cell 415 may be located at each intersection. For example, the memory die 400 may include memory cells 415 along each word line 405-a through 405-n at intersections of each of bit line 410-a through bit line 410-n through the respective word line 405 (e.g., memory cell 415-a through memory cell 415-m along the word line 405-a up to memory cell 415-n through memory cell 415-z along the word line 405-n).

The memory die 400 may include decoders 420 that support accessing the memory cells 415. Each of the decoders 420 may be coupled with an access line of the memory die 400 (e.g., a word line 405 or a bit line 410) and be configured to bias the access line to one or more operating voltages such that a voltage differential may be applied across a memory cell 415 in accordance with an access operation (e.g., a write operation, a read operation). For example, the memory die 400 may include a decoder 420-a through a decoder 420-m that are each coupled with a bit line 410 (e.g., bit line 410-a through bit line 410-n, respectively). The memory die may further include a decoder 420-b through a decoder 420-n that are each coupled with a word line 405 (e.g., word line 405-a through word line 405-n, respectively). In some cases, the decoders 420 may be examples of complementary metal-oxide-semiconductor (CMOS) circuits, which may refer to various examples of a complementary and symmetrical pair of a p-type transistor and an n-type transistor. In some examples, the decoders 420 may be examples of CMOS circuits that are located (e.g., formed) under the memory cells 415, which may be referred to as a CMOS under an array of memory cells (CuA) circuit, which may be positioned below a footprint of an array of memory cells. In some examples, the decoders 420 may be formed to occupy a footprint corresponding to a pitch of a memory cell 415, where a pitch of a memory cell 415 may equal a distance between two adjacent memory cells 415 along a same access line. Accordingly, as a size of the memory cells 415 is reduced, a size of the decoders 420 may also be reduced in order to occupy, but not extend beyond, the reduced footprint of the memory cells 415. As a result, a size (e.g., area) of the memory die 400 may be reduced in accordance with a scaling of the memory cells 415.

In some cases, however, a reduced size of the decoders 420 may render the decoders 420 unable to support correct operation (e.g., biasing) of the memory cells 415. For example, a decoder 420 may include at least a pair of transistors used to bias an access line. As the transistors of the decoder 420 are scaled down, a channel from a drain of a transistor to a source of the transistor may become shorter, which may cause short channel effects such as increased leakage current, threshold voltage roll-off, and hot carrier effects, among other short channel effects. In some cases, these effects (or combinations thereof) may reduce the effectiveness of the transistors ability to bias the access lines to the target voltages. In some cases, the increased leakage current may render the decoder 420 inoperable, and thus a scaling of the decoders 420 may be limited relative to a scaling of the memory cells 415. As a result, a scaling of the memory die 400 may be limited to the scaling of the decoders 420 (e.g., rather than the scaling of the memory cells 415).

In order to support scaling of the memory die 400, the decoders 420 may be examples of hybrid decoders that include a planar transistor 425 and a trench transistor 430. The planar transistor 425 may be coupled with the trench transistor 430, and a corresponding access line may be coupled between the planar transistor 425 and the trench transistor 430. In some examples, the trench transistor 430 may support a scaling (e.g., smaller area or smaller footprint) of a decoder 420 and the planar transistor 425 may maintain aspects of a performance of the decoder 420. For example, each of the planar transistor 425 and the trench transistor 430 may include a gate electrode formed on a substrate, and a gate electrode of the trench transistor may also extend into a cavity (e.g., a trench) formed in the substrate, which, in some examples, may reduce the short channel effects associated with reduced transistor size. Accordingly, the area or footprint of the trench transistor 430 may be scaled down further compared to the planar transistor 425, thereby reducing a size of the decoder 420.

Additionally, the planar transistor 425 may be configured to operate as a "pass" transistor and the trench transistor 430 may be configured to operate as a "ground" transistor. For example, the planar transistor 425 may be coupled with a first voltage source and may pass a first voltage supplied by the first voltage source to the access line, thus biasing the access line to the first voltage. The trench transistor 430 may be coupled with a second voltage source, which may be a ground voltage, and may be configured to bias the access line to ground, for example, to prevent a voltage of the access line from floating if the planar transistor 425 is disabled (e.g., not activated).

In some examples, a power consumption associated with operation of the decoder 420 may be based on a body effect of the planar transistor 425 and the trench transistor 430. For example, in some cases, the first voltage supplied by the first voltage source may not be fully passed by a pass transistor. Instead, a reduced voltage may be passed based on a body effect of the pass transistor. The poorer the body effect, the more the first voltage is reduced. Accordingly, to bias the access line to the first voltage, the first voltage source may supply an increased voltage relative to the first voltage, or an external supply may overdrive a gate electrode of the pass transistor, to compensate for the body effect. Thus, an improved body effect of the pass transistor may reduce a power consumption associated with operating the decoder 420. In some cases, trench transistors 430 may be associated with relatively poorer body effects than planar transistors 425. Accordingly, by configuring the planar transistor 425 to operate as the pass transistor, the power consumption of the decoder 420 may be reduced compared to configuring the trench transistor 430 to operate as the pass transistor. Additionally, because ground transistors bias the access line to ground, body effect requirements may be relatively less stringent for ground transistors compared to pass transistors. Accordingly, by including both a planar transistor 425 to operate as a pass transistor and a trench transistor 430 to operate as a ground transistor, a decoder 420 may both support scaling and maintain performance at the reduced dimensions.

Multiple decoders 420 may operate in conjunction to operate the memory cells 415. For example, a decoder 420 coupled with a bit line 410 (e.g., a decoder 420-a through a decoder 420-m) may operate in conjunction with a decoder 420 coupled with a word line 405 (e.g., a decoder 420-b through a decoder 420-n) in order to access a given memory cell 415. For instance, the decoder 420-a may bias the bit line 410-a in conjunction with the decoder 420-b biasing the word line 405-a in order to access the memory cell 415-a. The decoder 420-a may include a planar transistor 425-a and a trench transistor 430-a. The planar transistor 425-a may be coupled with a voltage source 435 that supplies a voltage $V_1$ (e.g., or an increased voltage relative to $V_1$ that compensates for a body effect of the planar transistor 425-a), the bit line 410-a, and the trench transistor 430-a. The trench transistor 430-a may further be coupled with the bit line 410-a and a voltage source 440 that supplies a voltage $V_2$ (e.g., which may be a ground voltage). The planar transistor 425-a may be activated via a gate signal $G_1$ (e.g., from a controller of the memory die 400 such as a local memory controller 165, a local memory controller 245, or a column decoder 225) to bias the bit line 410-a to $V_1$, and the trench transistor may be activated via a gate signal $G_2$ (e.g., from a controller of the memory die 400 such as a local memory controller 165, a local memory controller 245, or a row decoder 220) to bias the bit line 410-a to $V_2$.

The decoder 420-b may include a planar transistor 425-b and a trench transistor 430-b. The planar transistor 425-b may be coupled with a voltage source 445 that supplies a voltage $V_3$ (e.g., or an increased voltage relative to $V_3$ that compensates for a body effect of the planar transistor 425-b), the word line 405-a, and the trench transistor 430-b. The trench transistor 430-b may further be coupled with the word line 405-a and a voltage source 450 that supplies a voltage $V_3$ (e.g., which may be a ground voltage). The planar transistor 425-b may be activated via a gate signal $G_3$ (e.g., from a controller of the memory die 400) to bias the word line 405-a to $V_3$, and the trench transistor may be activated via a gate signal $G_4$ (e.g., from a controller of the memory die 400) to bias the word line 405-a to $V_4$. In some examples, $V_1$ may correspond to a voltage V and $V_3$ may correspond to −V. Here, the controller of the memory die 400 may use the decoder 420-a and the decoder 420-b to apply a voltage differential of 2V across the memory cell 415-a, for example, to perform a read operation or a write operation. In this way, the memory die 400 may support operating and accessing memory cells 415 using decoders 420 that support scaling.

Figure 5A:
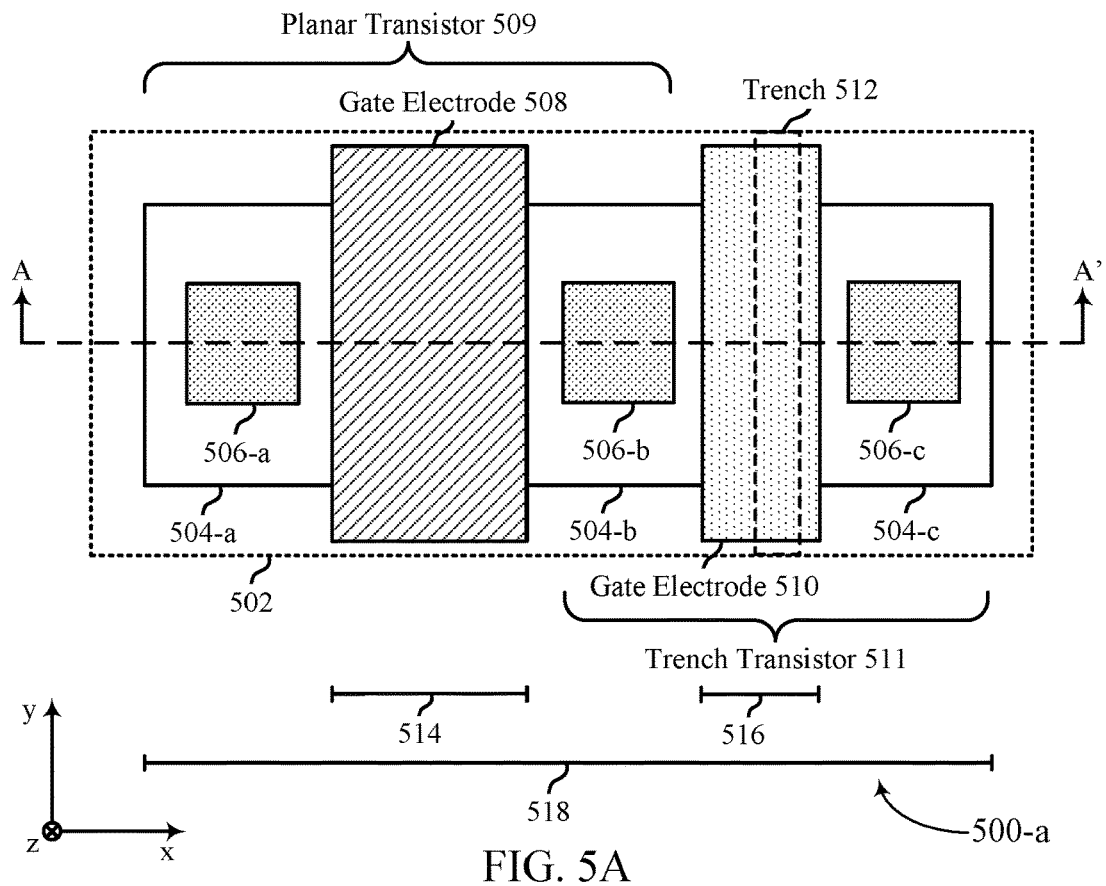
FIG. 5A illustrates an example of a top plan diagram of a circuit that supports memory device decoder configurations in accordance with examples as disclosed herein.

FIG. 5A illustrates an example of a top plan diagram of a circuit 500-a that supports memory device decoder configurations in accordance with examples as disclosed herein. The circuit 500-a may be an example of a decoder that supports scaling, such as a decoder 420 as described with reference to FIG. 4. For illustrative purposes, aspects of the decoder may be described with reference to an x-direction, a y-direction, and a z-direction (e.g., a height direction) of a coordinate system. In some examples, the z-direction may be illustrative of a direction perpendicular to a surface of a substrate 502 (e.g., a surface in an xy-plane). In some examples, the substrate 502 may be a portion of a semiconductor wafer, such as a silicon chip of a memory die (e.g., crystalline silicon, monocrystalline silicon), among other examples of substrate material.

The decoder may include a planar transistor 509 and a trench transistor 511 (which may be examples of a planar transistor 425 and a trench transistor 430 described with reference to FIG. 4, respectively) that are formed at least in part by doping portions of the substrate 502. For example, the substrate 502 may be doped to form various active regions 504, which may correspond to a source or a drain of the planar transistor 509 or the trench transistor, or both. For instance, the substrate may be doped to form an active region 504-a, an active region 504-b, and an active region 504-c. In some examples, the active region 504-a may function as a drain of the planar transistor 509, and the active region 504-b may function as a source of the planar transistor 509. In some examples, the active region 504-b may function as a drain of the trench transistor 511, and the active region 504-c may function as a source of the trench transistor 511. In some cases, the active region 504-*b* may be shared between the planar transistor 509 and the trench transistor 511. For example, the active region 504-*b* may function as both the source of the planar transistor 509 and the drain of the trench transistor 511.

Additionally, various electrodes 506 may be formed (e.g., deposited) on the active regions 504, which may function as conductive (e.g., electrical) contacts via which a controller (e.g., a local memory controller 165, a local memory controller 245, a row decoder 220, a column decoder 225) may operate the planar transistor 509 and the trench transistor 511. For example, an electrode 506-*a* may be formed on the active region 504-*a*, an electrode 506-*b* may be formed on the active region 504-*b*, and an electrode 506-*c* may be formed on the active region 504-*c*. In some examples, the electrode 506-*a* may function as a drain electrode of the planar transistor 509, and the electrode 506-*b* may function as a source electrode of the planar transistor 509. In some examples, the electrode 506-*b* may function as a drain electrode of the trench transistor 511, and the electrode 506-*c* may function as a source electrode of the trench transistor 511. In some cases, the electrode 506-*b* may be shared between the planar transistor 509 and the trench transistor 511. For example, the electrode 506-*b* may function as both the source electrode of the planar transistor 509 and the drain electrode of the trench transistor 511. In some examples, the planar transistor 509 and the trench transistor 511 may be arranged in a CMOS configuration (e.g., based on sharing the active region 504-*b* and the electrode 506-*b*). In some examples, the planar transistor and the trench transistor 511 may be coupled with an access line via the electrode 506-*b*.

The planar transistor 509 may include a gate electrode 508 that is formed above (e.g., on, physically separated from by a gate dielectric but coupled with) the substrate 502. The planar transistor 509 may be activated via a signal (e.g., a positive threshold voltage, a negative threshold voltage) applied to the gate electrode 508 that enables a channel (e.g., a conductive path) between the active region 504-*a* and the active region 504-*b* through which current may flow.

The trench transistor 511 may include a gate electrode 510 that is formed above (e.g., on, physically separated from by a gate dielectric but coupled with) the substrate 502 and may be activated via a signal applied to the gate electrode 510 that enables a channel (e.g., a conductive path) between the active region 504-*b* and the active region 504-*c* through which current may flow. Additionally, the gate electrode 510 may extend into a trench 512 formed in the substrate 502 (e.g., a cavity etched into the substrate 502). For example, to form the planar transistor 509 and the trench transistor 511, a manufacturing system may form the substrate 502. Then, the manufacturing system may etch the trench 512 into the substrate 502, form a first gate dielectric on the substrate 502 and a second gate dielectric on the substrate 502 that extends into the trench 512, form (e.g., deposit) the gate electrode 508 on (e.g., above) the first gate dielectric, and form the gate electrode 510 over and into the trench 512 (e.g., above the second gate dielectric). Subsequently, the manufacturing system may form spacers (not shown) that insulate the gate electrodes from the electrodes 506, dope the portions of the substrate 502 to form the active regions 504, form the electrodes 506, and form additional contacts or interconnects to other components of a memory die.

In some examples, the gate electrode 510 may include a first portion that extends into the trench 512 and a second portion that asymmetrically overlays an opening of the trench 512 (e.g., in the x-direction). The second portion of the gate electrode 510 may extend asymmetrically from the trench 512 to the electrode 506-*b* and the electrode 506-*c* in the x-direction. For example, the second portion of the gate electrode 510 may be longer from the trench 512 to the electrode 506-*b* in the x-direction than from the trench 512 to the electrode 506-*c* in the x-direction. In some cases, the second portion of the gate electrode 510 asymmetrically overlaying the opening of the trench 512 may result in the gate electrode 510 being located closer to the electrode 506-*b* (e.g., the drain electrode of the trench transistor 511) than the electrode 506-*c* (e.g., the source electrode of the trench transistor 511). In some examples, the trench 512 may be formed (e.g., etched) closer to the electrode 506-*c* than the electrode 506-*b*, and the asymmetric overlaying of the second portion of the gate electrode 510 may result in the a distance between the gate electrode 510 and the electrode 506-*b* being the same as a distance between the gate electrode 510 and the electrode 506-*c*.

In some examples, the gate electrode 510 asymmetrically overlaying the opening of the trench 512 may reduce a leakage current associated with the trench transistor 511. For example, the planar transistor 509 may be coupled with a first voltage source via the electrode 506-*a*, and the trench transistor may be coupled with a ground voltage source via the electrode 506-*c*. When planar transistor 509 is activated, the first voltage source may pass a voltage V supplied by the first voltage source to the electrode 506-*b* to bias the access line coupled with the decoder. In some cases, passing V to the electrode 506-*b* may cause GIDL current to occur at the trench transistor 511. For example, a quantity of GIDL current that occurs at the trench transistor 511 may be based on a drain-to-body voltage VDB and a source-to-body voltage VSB experienced at the trench transistor 511. As VDB or VsB increases, the quantity of GIDL current also increases. In some examples, portions of the substrate 502 may be referred to as the body of the trench transistor 511 and the body of the trench transistor may be biased to −V. Accordingly, if passing V to the electrode 506-*b*, a magnitude of VDB of the trench transistor may be 2V (e.g., due to the electrode 506-*b* being biased to V and the body being biased to −V), and a magnitude of VsB of the trench transistor may be V (e.g., due to the electrode 506-*c* being biased to ground and the body being biased to −V). Thus, the magnitude of VDB may be twice the magnitude of VsB when the planar transistor 509 is activated. However, increasing a size (e.g., a length) of a gate electrode may reduce GIDL current experienced at a transistor. Accordingly, by asymmetrically overlaying the gate electrode 510 such that it extends further to the electrode 506-*b* than the electrode 506-*c*, the length of the gate electrode 510 may be artificially increased from the drain-to-gate perspective of the trench transistor, thus reducing the GIDL current experienced at the trench transistor 511. That is, because the magnitude of VDB may be twice the magnitude of VsB when the planar transistor 509 is activated, a greater portion of a total length of the gate electrode 510 may formed be between the trench 512 and the electrode 506-*b* than the trench 512 and the electrode 506-*c* in order reduce the GIDL current caused by VDB relative to if the gate electrode 510 symmetrically overlaid the trench 512.

The decoder may support scaling based at least in part on including the trench transistor 511. For example, the gate electrode 508 may have a length 514 in the x-direction and the gate electrode 510 may have a length 516 in the x-direction that is less than the length 514. Based on the length 514 being greater than the length 516, the planar transistor 509 may be longer (e.g., physically longer) than the trench transistor 511 in the x-direction. Additionally, the decoder may have a length 518 in the x-direction that is less than a decoder that includes two planar transistors 509 based on including the trench transistor 511 that is shorter than the planar transistor 509 in the x-direction.

Figure 5B:
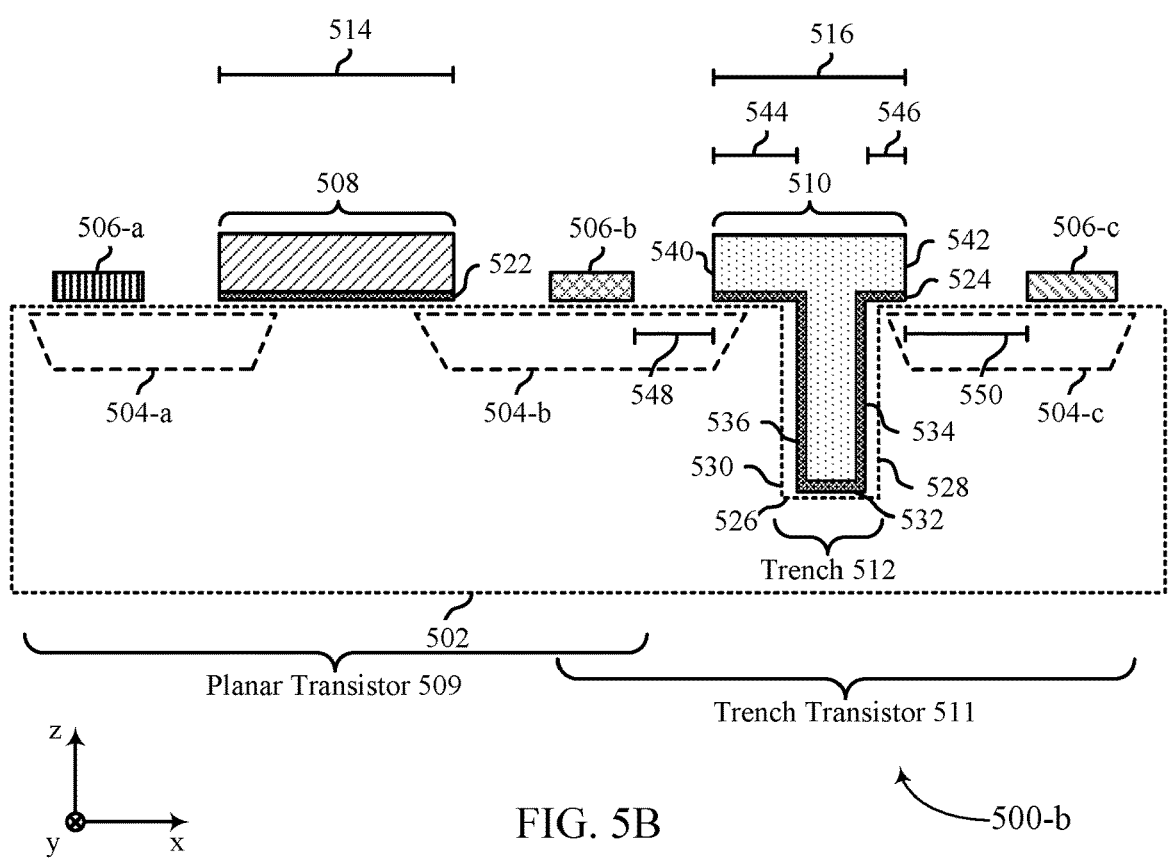
FIG. 5B illustrates an example of a side elevation diagram of the circuit of FIG. 5A that supports memory device decoder configurations in accordance with examples as disclosed herein.

FIG. 5B illustrates an example of a side elevation diagram of a circuit 500-*b* that supports memory device decoder configurations in accordance with examples as disclosed herein. The circuit 500-*b* is a cross-sectional view of the circuit 500-*a* described with reference to FIG. 5A along the line A-A' shown in FIG. 5A. For illustrative purposes, aspects of the decoder may be described with reference to an x-direction, a y-direction, and a z-direction of a coordinate system. In some examples, the z-direction may be illustrative of a direction perpendicular to a surface of the substrate 502 (e.g., a surface in an xy-plane, a surface upon or over which other materials may be deposited), and each of the related regions, illustrated by their respective cross-section in an xz-plane, may extend for some distance along the y-direction.

As described with reference to FIG. 5A, the decoder may include the planar transistor 509 and the trench transistor 511 (e.g., arranged in a CMOS configuration). The active regions 504-*a*, 504-*b*, and 504-*c* may be formed by doping each region of the substrate 502 according to a n-type doping or a p-type doping. Additionally, electrodes 506-*a*, 506-*b*, and 506-*c* may be formed on (e.g., in direct contact with) the substrate 502. In the example of FIG. 5B, the electrode 506-*a* may function as the drain electrode of the planar transistor 509, and the electrode 506-*b* may function as the source electrode of the planar transistor 509. Additionally, the electrode 506-*b* may function as the drain electrode of the trench transistor 511, and the electrode 506-*c* may function as the source electrode of the trench transistor 511.

The planar transistor 509 may include the gate electrode 508 that is deposited on the substrate 502. The gate electrode 508 may be physically separated from the substrate 502 by a gate insulation portion 522 (e.g., a gate dielectric, a gate oxide). The gate electrode 508 may have a length 514 (e.g., a physical length) in the x-direction.

The trench transistor 511 may include the gate electrode 510 that is deposited on the substrate 502 and into the trench 512. That is, the gate electrode 510 may be formed on the substrate 502 (e.g., contact a top surface of the substrate 502) and over the trench 512 such that a portion of the gate electrode 510 extends into the trench 512. The gate electrode 510 may be physically separated from the substrate 502 and the trench 512 by a gate insulation portion 524 (e.g., a gate dielectric, a gate oxide).

The trench 512 may have a bottom surface 526, a sidewall 528, a sidewall 530, and an opening opposite the bottom surface 526. The bottom surface 526 may have a first length in the x-direction, the opening may have a second length in the x-direction (e.g., which may or may not be equal to the first length), and the sidewall 528 and the sidewall 530 may have a first height in the z-direction. The sidewall 528 may be closer to the electrode 506-*c* than the electrode 506-*b* (e.g., may be a source electrode side sidewall), and the sidewall 530 may be closer to the electrode 506-*b* than the electrode 506-*c* (e.g., may be a drain electrode side sidewall).

The gate electrode 510 and the gate insulation portion 524 may each have a first portion that extends into the trench 512 and a second portion that overlays the opening of the trench 512. The second portion of the gate insulation portion 524 may contact a top surface of the substrate 502 and the second portion of the gate electrode may be above (e.g., on) the second portion of the gate insulation portion 524. The first portion of the gate electrode insulation portion 524 may have a bottom surface 532, a sidewall 534, and a sidewall 536. Additionally, the first portion of the gate electrode 510 may extend into the trench 512 such that the first portion of the gate electrode 510 contacts inner surfaces of the first portion of the gate insulation portion 524 corresponding to the bottom surface 532, the sidewall 534, and the sidewall 536. In some examples, the bottom surface 532 may contact the bottom surface 526. In some examples, the sidewall 534 may contact the sidewall 528, or the sidewall 536 may contact the sidewall 530, or both. The bottom surface 532 may have a third length in the x-direction (e.g., which may be approximately equal to the first length), and the sidewall 534 and the sidewall 536 may have a second height in the z-direction (e.g., which may be approximately equal to the first height). The sidewall 534 may be closer to the electrode 506-*c* than the electrode 506-*b* (e.g., may be a source electrode side sidewall), and the sidewall 536 may be closer to the electrode 506-*b* than the electrode 506-*c* (e.g., may be a drain electrode side sidewall). The second portion of the gate electrode 510 may have a sidewall 540, a sidewall 542, and a top surface. The sidewall 540 may be closer to the electrode 506-*b* than the electrode 506-*c*, and the sidewall 542 may be closer to the electrode 506-*c* than the electrode 506-*b*. Additionally, the second portion of the gate electrode 510 may have a length 516 in the x-direction, which may be referred to as the length of the gate electrode 510. The length 516 may be less than the length 514 of the gate electrode 508.

The trench transistor 511 may have an asymmetrical distance between the gate electrode 510 and the electrode 506-*b* and between the gate electrode 510 and the electrode 506-*c*. For example, the second portion of the gate electrode 510 may asymmetrically overlay the opening of the trench 512. For instance, a distance 544 between the sidewall 536 and the sidewall 540 may be greater than a distance 546 between the sidewall 534 and the sidewall 542. In other words, a greater quantity of the second portion of the gate electrode 510 may be deposited on the drain side of the trench transistor 511 than the source side of the trench transistor 511. In some examples, this may result in a distance 548 between the sidewall 540 and the electrode 506-*b* being less than a distance 550 between the sidewall 542 and the electrode 506-*c* (e.g., based on the trench 512 being centered between the electrode 506-*c* and the electrode 506-*b*). In some examples, the asymmetrical distance between the gate electrode 510 and the electrode 506-*b* and between the gate electrode 510 and the electrode 506-*c* may reduce GIDL current experienced at the trench transistor 511. In some cases, the distance 548 and the distance 550 may be the same based on the trench 512 being offset (e.g., located) closer to the electrode 506-*c* than the electrode 506-*b* and the second portion of the gate electrode asymmetrically overlaying the opening of the trench 512. In some cases, having the greater quantity of the second portion of the gate electrode 510 deposited on the drain side of the trench transistor 511 than the source side of the trench transistor 511 may reduce GIDL current experienced at the trench transistor 511. In some examples, a length of spacers between the gate electrodes and the electrodes 506 (not shown) may be symmetrical.

Figure 6A:
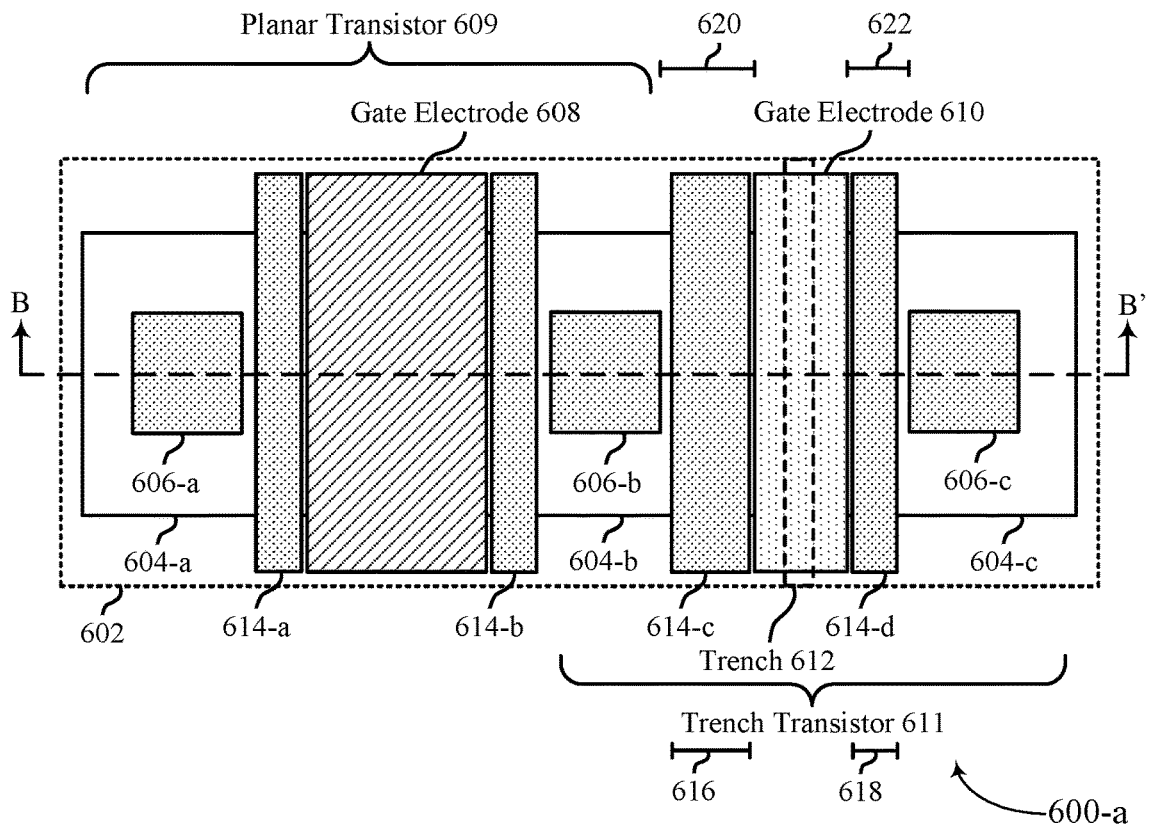
FIG. 6A illustrates an example of a top plan diagram of a circuit that supports memory device decoder configurations in accordance with examples as disclosed herein.

FIG. 6A illustrates an example of a top plan diagram of a circuit 600-*a* that supports memory device decoder configurations in accordance with examples as disclosed herein. The circuit 600-*a* may be an example of a decoder that supports scaling, such as a decoder 420 as described with reference to FIG. 4. For illustrative purposes, aspects of the decoder may be described with reference to an x-direction, a y-direction, and a z-direction (e.g., a height direction) of a coordinate system. In some examples, the z-direction may be illustrative of a direction perpendicular to a surface of a substrate 602 (e.g., a surface in an xy-plane), which may be an example of a substrate 502 described with reference to FIGS. 5A and 5B.

The decoder may include a planar transistor 609 and a trench transistor 611 (which may be examples of a planar transistor 425 and a trench transistor 430 described with reference to FIG. 4, respectively) that are formed at least in part by doping portions of the substrate 602. For example, the substrate 602 may be doped to form active regions 604-a, 604-b, and 604-c, which may be examples of active regions 504-a, 504-b, and 504-c described with reference to FIGS. 5A and 5B, respectively. Additionally, electrodes 606 may be formed (e.g., deposited) on the active regions 604. For example, an electrode 606-a may be formed on the active region 604-a, an electrode 606-b may be formed on the active region 604-b, and an electrode 606-c may be formed on the active region 604-c, which may be examples of the electrodes 506-a, 506-b, and 506-c described with reference to FIGS. 5A and 5B, respectively.

The planar transistor 609 may include a gate electrode 608 that is formed above (e.g., on, physically separated from by a gate dielectric but coupled with) the substrate 602 and may be activated via a signal applied to the gate electrode 608. Additionally, the planar transistor 609 may include a spacer 614-a between the gate electrode 608 and the electrode 606-a and a spacer 614-b between the gate electrode 608 and the electrode 606-b. The spacer 614-a and the spacer 614-b may be formed on the substrate 602 from an insulating material that insulates the gate electrode 608 from the electrode 606-a and the electrode 606-b.

The trench transistor 611 may include a gate electrode 610 that is formed above (e.g., on, physically separated from by a gate dielectric but coupled with) the substrate 602 and may be activated via a signal applied to the gate electrode 610. The trench transistor 611 may also include a spacer 614-c between the gate electrode 610 and the electrode 606-b and a spacer 614-d between the gate electrode 610 and the electrode 606-c. The spacer 614-c and the spacer 614-d may be formed on the substrate 602 from an insulating material that insulates the gate electrode 610 from the electrode 606-b and the electrode 606-c. The gate electrode 610 may also extend into a trench 612 formed in the substrate 602 (e.g., a cavity etched into the substrate 602). For example, to form the planar transistor 609 and the trench transistor 611, a manufacturing system may form the substrate 602. Then, the manufacturing system may etch the trench 612 into the substrate 602, form a first gate dielectric on the substrate 602 and a second gate dielectric on the substrate 602 that extends into the trench 612, form (e.g., deposit) the gate electrode 608 on (e.g., above) the first gate dielectric, and form the gate electrode 610 over and into the trench 612 (e.g., above the second gate dielectric). Subsequently, the manufacturing system may form the spacers 614, dope the substrate 602 to form the active regions 604, form the electrodes 606, and form additional contacts or interconnects to other components of a memory die.

In some examples, the gate electrode 610 may include a first portion that extends into the trench 612 and a second portion that symmetrically overlays an opening of the trench 612 (e.g., in the x-direction). In some examples, the spacer 614-c and the spacer 614-d may have asymmetric (e.g., uneven) lengths in the x-direction. For example, the spacer 614-c may have a length 616 on the x-direction that is longer than a length 618 of the spacer 614-d in the x-direction. In some cases, the gate electrode 610 may be located closer to the electrode 606-c than the electrode 606-b based on the asymmetric spacer lengths. For example, because the length 616 is longer than the length 618, a distance 620 between the gate electrode 610 and the electrode 606-b may be greater than a distance 622 between the gate electrode 610 and the electrode 606-c.

The asymmetric spacer lengths may reduce a leakage current associated with the trench transistor 611. For example, increasing a length of a spacer 614 may reduce GIDL current experienced at a transistor. For instance, a spacer 614 may reduce a doping of a portion of the substrate 602 located under the spacer 614 during the doping process. Thus, a longer length of the spacer 614-c may increase a separation between the drain of the trench transistor 611 and a channel through which current passes from the drain to the source of the trench transistor 611, thereby decreasing the GIDL current experienced at the trench transistor. Accordingly, because a magnitude of a drain-to-body voltage VDB of the trench transistor 611 may be greater than a magnitude of a source-to-body voltage VsB of the trench transistor 611, the spacer 614-c may be formed to be longer in the x-direction than the spacer 614-d, thereby reducing the GIDL current experienced at the trench transistor 611 (e.g., while reducing a length of the trench transistor 611 based on having a shorter spacer 614-d).

The decoder may support scaling based at least in part on including the trench transistor 611. For example, the gate electrode 608 may have a first length in the x-direction that is longer than a second length of the gate electrode 610 in the x-direction, and thus, the planar transistor 609 may be longer (e.g., physically longer) in the x-direction than the trench transistor in the x-direction. As a result, the decoder may have a third length in the x-direction that is less than a decoder that includes two planar transistors 609 based on including the trench transistor 611 that is shorter than the planar transistor 609 in the x-direction.

Figure 6B:
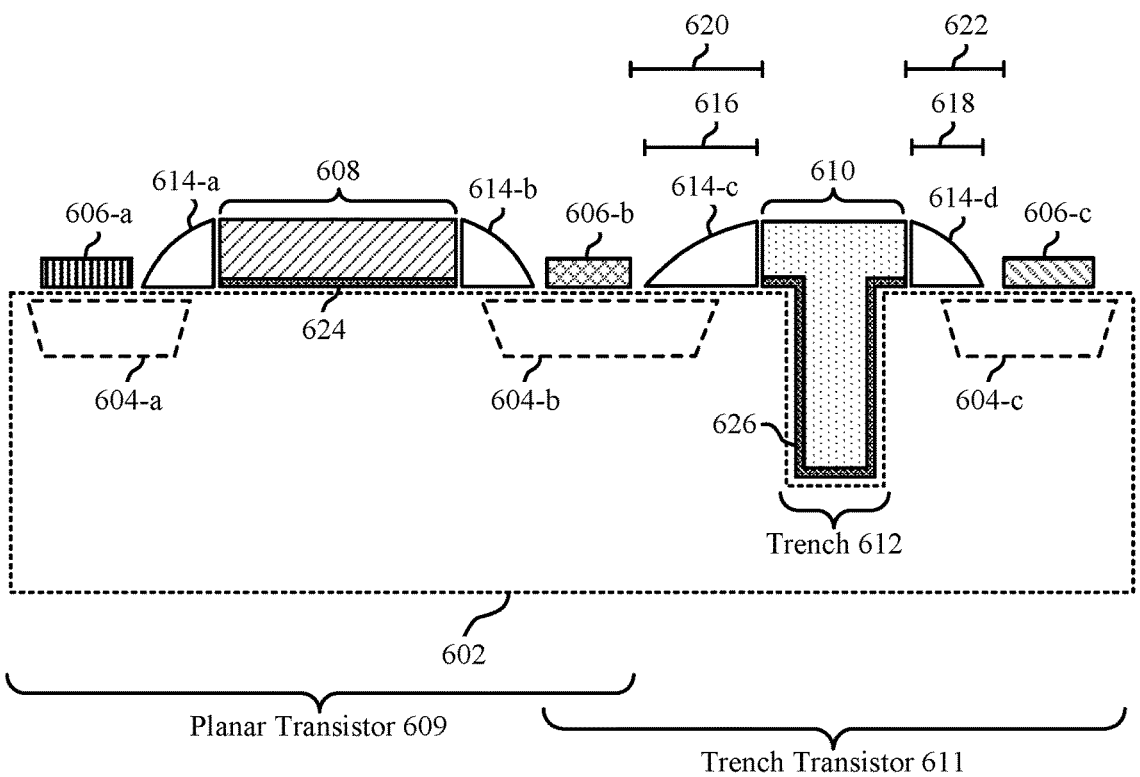
FIG. 6B illustrates an example of a side elevation diagram of the circuit of FIG. 6A that supports memory device decoder configurations in accordance with examples as disclosed herein.

FIG. 6B illustrates an example of a side elevation diagram of a circuit 600-b that supports memory device decoder configurations in accordance with examples as disclosed herein. The circuit 600-b is a cross-sectional view of the circuit 600-a described with reference to FIG. 6A along a line B-B' shown in FIG. 6A. For illustrative purposes, aspects of the decoder may be described with reference to an x-direction, a y-direction, and a z-direction of a coordinate system. In some examples, the z-direction may be illustrative of a direction perpendicular to a surface of the substrate 602 (e.g., a surface in an xy-plane, a surface upon or over which other materials may be deposited), and each of the related regions, illustrated by their respective cross-section in an xz-plane, may extend for some distance along the y-direction.

As described with reference to FIG. 6A, the decoder may include the planar transistor 609 and the trench transistor 611 (e.g., arranged in a CMOS configuration). The active regions 604-a, 604-b, and 604-c may be formed by doping each region of the substrate 602 according to a n-type doping or a p-type doping. Additionally, electrodes 606-a, 606-b, and 606-c may be formed on (e.g., in direct contact with) the substrate 602. In the example of FIG. 6B, the electrode 606-a may function as the drain electrode of the planar transistor 609, and the electrode 606-b may function as the source electrode of the planar transistor 609. Additionally, the electrode 606-b may function as the drain electrode of the trench transistor 611, and the electrode 606-*c* may function as the source electrode of the trench transistor 611.

The planar transistor 609 may include the gate electrode 608 that is deposited on the substrate 602 and may be physically separated from the substrate 602 by a gate insulation portion 624 (e.g., a gate dielectric, a gate oxide). Additionally, the planar transistor 609 may include the spacer 614-*a* and the spacer 614-*b* formed between the gate electrode 608 and the electrode 606-*a* and between the gate electrode 608 and the electrode 606-*b*, respectively.

The trench transistor 611 may include the gate electrode 610 that is deposited on the substrate 602 and into the trench 612 and may be physically separated from the substrate 602 by a gate insulation portion 626 (e.g., a gate dielectric, a gate oxide). That is, the gate insulation portion 626 may be formed on the substrate 602 (e.g., contact a top surface of the substrate 602) and over the trench 612 such that a first portion of the gate insulation portion 626 extends into the trench 612. The gate electrode 610 may be formed on (e.g., above) the gate insulation portion 626 and a first portion of the gate electrode 610 may extend into the trench 612. Additionally, the gate insulation portion 626 may have a second portion that overlays the opening of the trench 612 and contacts a top surface of the substrate 602, and the gate electrode 610 may have a second portion formed (e.g., deposited) on the second portion of the gate insulation portion 626 that overlays the opening of the trench 612. The trench 612 may have a bottom surface, two sidewalls, and an opening opposite the bottom surface. The first portion of the gate insulation portion 626 may have a bottom surface and two sidewalls, each of which may respectively be in contact with the bottom surface and two sidewalls of the trench 612. The first portion of the gate electrode 610 may have a bottom surface and two sidewalls, each of which may respectively be in contact with inner surfaces corresponding to the bottom surface and two sidewalls of the first portion of the gate insulation portion 626. The second portion of the gate electrode 610 may have two sidewalls and a top surface. In some examples, the second portion of the gate electrode 610 may symmetrically overlay the opening of the trench 612.

The trench transistor 611 may further include the spacer 614-*c* between the gate electrode 610 and the electrode 606-*b* and the spacer 614-*d* between the gate electrode 610- and the electrode 606-*c*. The spacer 614-*c* may have the length 616 in the x-direction that is longer than the length 618 of the spacer 614-*d* in the x-direction. In some cases, the gate electrode 610 may be located closer to the electrode 606-*c* than the electrode 606-*b* based on the length 616 being longer than the length 618. For example, the active region 604-*b* may be formed further away from the trench 612 than the active region 604-*c*, for instance, to provide sufficient space for the formation of the spacer 614-*c*. As a result, the distance 620 between the gate electrode 610 and the electrode 606-*b* may be greater than the distance 622 between the gate electrode 610 and the electrode 606-*c*. Accordingly, the trench transistor 611 may have an asymmetrical distance between the gate electrode 610 and the electrode 606-*b* (e.g., the drain electrode of the trench transistor 611) and between the gate electrode 610 and the electrode 606-*c* (e.g., the source electrode of the trench transistor 611).

Figure 7A:
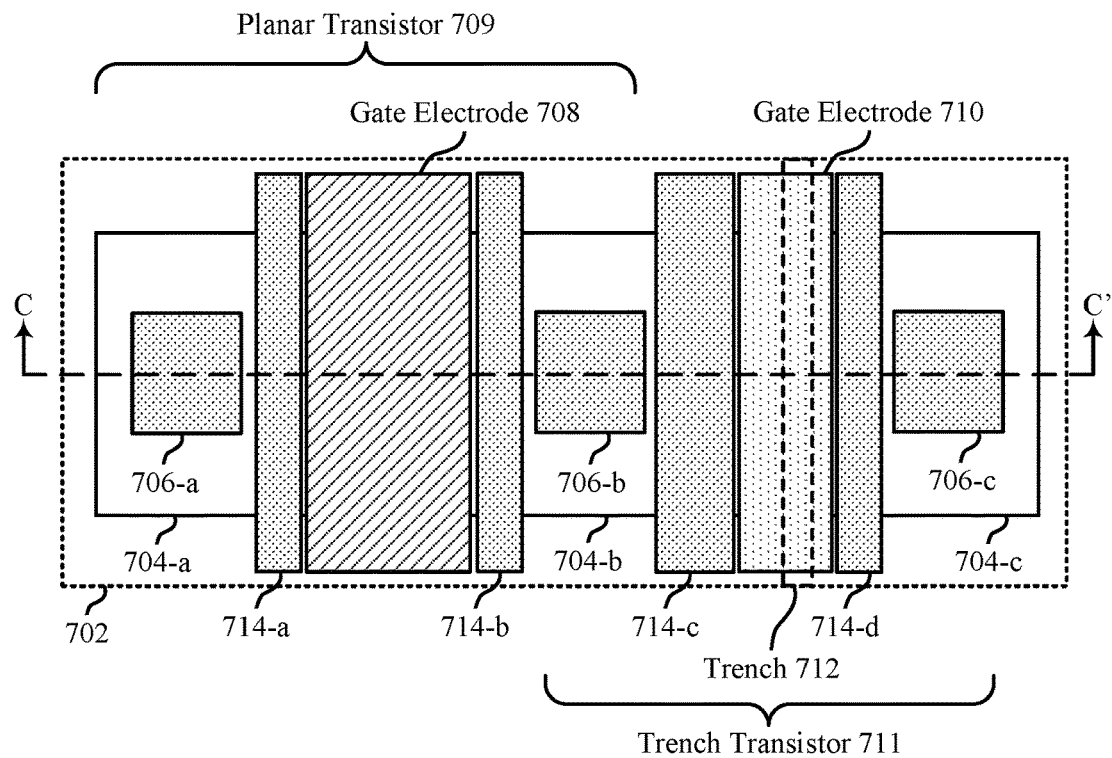
FIG. 7A illustrates an example of a top plan diagram of a circuit that supports memory device decoder configurations in accordance with examples as disclosed herein.

FIG. 7A illustrates an example of a top plan diagram of a circuit 700-*a* that supports memory device decoder configurations in accordance with examples as disclosed herein. The circuit 700-*a* may be an example of a decoder that supports scaling, such as a decoder 420 as described with reference to FIG. 4. For illustrative purposes, aspects of the decoder may be described with reference to an x-direction, a y-direction, and a z-direction (e.g., a height direction) of a coordinate system. In some examples, the z-direction may be illustrative of a direction perpendicular to a surface of a substrate 702 (e.g., a surface in an xy-plane), which may be an example of a substrate 502 or a substrate 602 described with reference to FIGS. 5A, 5B, 6A, and 6B.

The decoder may be an example of a decoder including aspects of the decoders described with reference to FIGS. 5A, 5B, 6A, and 6B. For example, the decoder may include a planar transistor 709 and a trench transistor 711 that are formed at least in part by doping portions of the substrate 702. For instance, the substrate 702 may be doped to form active regions 704-*a*, 704-*b*, and 704-*c*, which may be examples of active regions 504-*a*, 504-*b*, and 504-*c* and active regions 604-*a*, 604-*b*, and 604-*c* described with reference to FIGS. 5A, 5B, 6A, and 6B, respectively. Additionally, electrodes 706 may be formed (e.g., deposited) on the active regions 704. For example, an electrode 706-*a* may be formed on the active region 704-*a*, an electrode 706-*b* may be formed on the active region 704-*b*, and an electrode 706-*c* may be formed on the active region 704-*c*, which may be examples of the electrodes 506-*a*, 506-*b*, and 506-*c* and electrodes 606-*a*, 606-*b*, and 606-*c* described with reference to FIGS. 5A, 5B, 6A, and 6B, respectively.

Figure 7B:
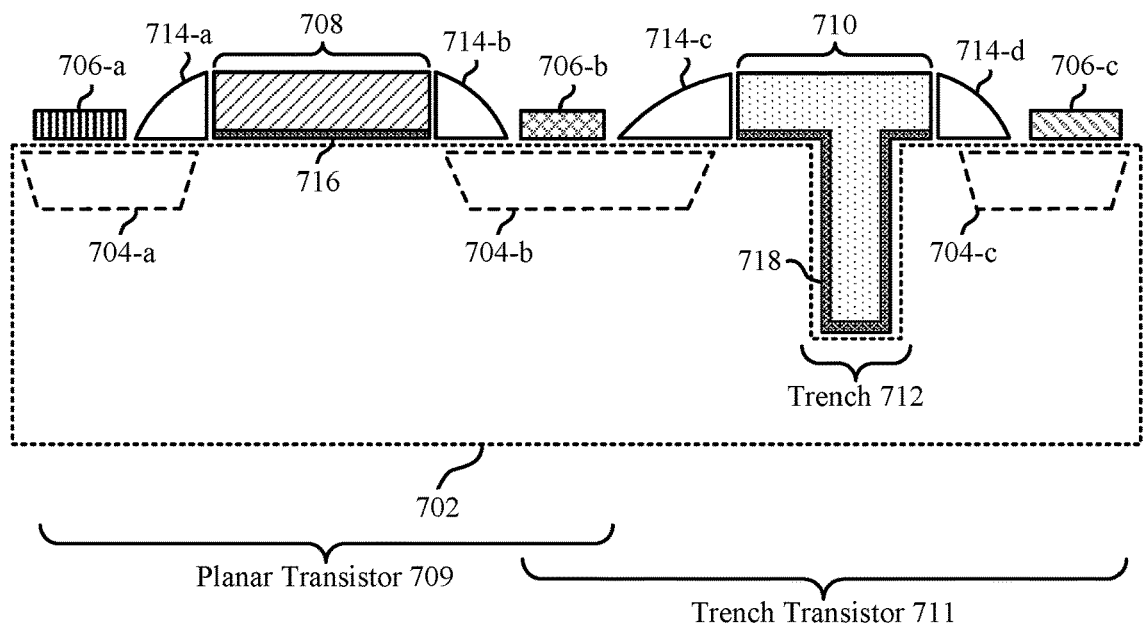
FIG. 7B illustrates an example of a side elevation diagram of the circuit of FIG. 7A that supports memory device decoder configurations in accordance with examples as disclosed herein.

Additionally, the planar transistor 709 may include a gate electrode 708, which may be an example of a gate electrode 508 or a gate electrode 608 described with reference to FIGS. 5A, 5B, 6A, and 6B, respectively, and may be physically separated from the substrate 702 by a gate insulation portion 716 as depicted in FIG. 7B (e.g., which may be an example of a gate insulation portion 522 or a gate insulation portion 624 described with reference to FIGS. 5B and 6B, respectively). The planar transistor 709 may further include a spacer 714-*a* between the gate electrode 708 and the electrode 706-*a* and a spacer 714-*b* between the gate electrode 708 and the electrode 706-*b*, which may be examples of a spacer 614-*a* and a spacer 614-*b* described with reference to FIGS. 6A and 6B.

The trench transistor 711 may include a gate electrode 710, which may be an example of a gate electrode 510 described with reference to FIGS. 5A and 5B. For example, the gate electrode 710 may include a first portion that extends into a trench 712 formed in the substrate 702 and a second portion that asymmetrically overlays an opening of the trench 712. The gate electrode 710 may be physically separated from the substrate 702 and the trench 712 by a gate insulation portion 718 as depicted in FIG. 7B (e.g., which may be an example of a gate insulation portion 524 or a gate insulation portion 626 described with reference to FIGS. 5B and 6B, respectively). The trench transistor 711 may also include a spacer 714-*c* between the gate electrode 710 and the electrode 706-*b* and a spacer 714-*d* between the gate electrode 710 and the electrode 706-*c*, which may be respective examples of a spacer 614-*c* and a spacer 614-*d* described with reference to FIGS. 6A and 6B. Accordingly, the trench transistor 711 may include both a second portion of the gate electrode that asymmetrically overlays the trench 712 and spacers 714 having asymmetric lengths.

FIG. 7B illustrates an example of a side elevation diagram of a circuit 700-*b* that supports memory device decoder configurations in accordance with examples as disclosed herein. The circuit 700-*b* is a cross-sectional view of the circuit 700-*a* described with reference to FIG. 7A along the line C-C' shown in FIG. 7A. For illustrative purposes, aspects of the decoder may be described with reference to an x-direction, a y-direction, and a z-direction of a coordinate system. In some examples, the z-direction may be illustrative of a direction perpendicular to a surface of the substrate 702 (e.g., a surface in an xy-plane, a surface upon or over which other materials may be deposited), and each of the related regions, illustrated by their respective cross-section in an xz-plane, may extend for some distance along the y-direction.

As described with reference to FIG. 7A, the trench transistor 711 may include multiple asymmetric aspects. For example, the trench transistor 711 may include gate electrode 710 and a gate insulation portion 718 that asymmetrically overlay the trench 712. Additionally, the trench transistor 711 may include the spacer 714-*c* that is longer in the x-direction than the spacer 714-*d*. Based on the asymmetric aspects of the trench transistor 711, the decoder may support scaling of the decoder and reduced GIDL current associated with reducing the scaling of transistors.

It should be noted that the methods described herein describe possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 1: An apparatus, including: a decoder circuit coupled with a conductive line and including a pair of transistors configured to bias the conductive line to one or more voltages, the pair of transistors including: a first transistor coupled with the conductive line and a first voltage source, the first transistor including a first gate electrode having a first length and formed on a substrate; and a second transistor coupled with the conductive line and a second voltage source, the second transistor including a second gate electrode having a second length and extending into a cavity of the substrate, where the second length of the second gate electrode is less than the first length of the first gate electrode.

Aspect 2: The apparatus of aspect 1, where the second gate electrode includes a first portion that extends into the cavity of the substrate and a second portion that asymmetrically overlays an opening of the cavity of the substrate.

Aspect 3: The apparatus of aspect 2, where a first distance between the second portion and a drain electrode of the second transistor is less than a second distance between the second portion and a source electrode of the second transistor.

Aspect 4: The apparatus of any of aspects 1 through 3, where the second transistor includes: a first spacer between the second gate electrode and a drain electrode of the second transistor; and a second spacer between the second gate electrode and a source electrode of the second transistor, where a length of the first spacer in a first direction is greater than a length of the second spacer in the first direction.

Aspect 5: The apparatus of any of aspects 1, 2, and 4, where the second gate electrode is located closer to a source electrode of the second transistor than to a drain electrode of the second transistor.

Aspect 6: The apparatus of any of aspects 1 through 5, where a length of the first transistor is greater than a length of the second transistor based at least in part on the second length of the second gate electrode being less than the first length of the first gate electrode.

Aspect 7: The apparatus of any of aspects 1 through 6, where the second voltage source is a ground voltage.

Aspect 8: The apparatus of any of aspects 1 through 7, where: the first transistor includes a planar transistor; and the second transistor includes a trench transistor.

An apparatus is described. The following provides an overview of aspects of the apparatus as described herein:

Aspect 9: An apparatus, including: an array of memory cells including one or more memory cells and an access line coupled with the one or more memory cells; a decoder circuit coupled with the array of memory cells and including a pair of transistors configured to bias the access line to one or more voltages, the pair of transistors including: a first transistor coupled with the access line and a first voltage source, the first transistor including a first gate electrode having a first length and formed on a substrate; and a second transistor coupled with the access line and a second voltage source, the second transistor including a second gate electrode having a second length and extending into a cavity of the substrate, where the second length of the second gate electrode is different than the first length of the first gate electrode.

Aspect 10: The apparatus of aspect 9, where the second gate electrode includes a first portion that extends into the cavity of the substrate and a second portion that asymmetrically overlays an opening of the cavity of the substrate.

Aspect 11: The apparatus of aspect 10, where a first distance between the second portion and a drain electrode of the second transistor is less than a second distance between the second portion and a source electrode of the second transistor.

Aspect 12: The apparatus of any of aspects 9 through 11, where the second transistor includes: a first spacer between the second gate electrode and a drain electrode; and a second spacer between the second gate electrode and a source electrode, where a length of the first spacer in a first direction is greater than a length of the second spacer in the first direction.

Aspect 13: The apparatus of any of aspects 9, 10, and 12, where the second gate electrode is located closer to a source electrode of the second transistor than a drain electrode of the second transistor.

Aspect 14: The apparatus of any of aspects 9 through 13, further including: a second decoder circuit coupled with the array of memory cells and including a second pair of transistors configured to bias a second access line to one or more second voltages, the second pair of transistors including: a third transistor coupled with the second access line and a third voltage source, the third transistor including a third gate electrode having a third length and formed on a substrate; and a fourth transistor coupled with the second access line and a fourth voltage source, the fourth transistor including a fourth gate electrode having a fourth length and extending into a second cavity of the substrate, where the fourth length of the fourth gate electrode is less than the third length of the third gate electrode.

Aspect 15: The apparatus of aspect 14, where the fourth gate electrode includes a first portion that extends into the second cavity of the substrate and a second portion that asymmetrically overlays the second cavity of the substrate.

Aspect 16: The apparatus of any of aspects 14 through 15, where the fourth transistor includes: a first spacer between the fourth gate electrode and a drain electrode of the fourth transistor; and a second spacer between the fourth gate electrode and a source electrode of the fourth transistor, where a length of the first spacer in a first direction is greater than a length of the second spacer in the first direction.

Aspect 17: The apparatus of any of aspects 14 through 16, where the fourth gate electrode is located closer to a source electrode of the fourth transistor than a drain electrode of the fourth transistor.

Aspect 18: The apparatus of any of aspects 14 through 17, where the first voltage source is a positive voltage source, the third voltage source is a negative voltage source, and the second voltage source and the fourth voltage source are ground voltage sources.

An apparatus is described. The following provides an overview of aspects of the apparatus as described herein:

Aspect 19: An apparatus, including: a decoder circuit coupled with a conductive line and including a pair of transistors configured to bias the conductive line to one or more voltages, the pair of transistors including: a first transistor coupled with the conductive line and a first voltage source, the first transistor including a first gate electrode formed on a substrate; and a second transistor coupled with the conductive line and a second voltage source, the second transistor having an asymmetrical distance between a second gate electrode and a drain electrode and between the second gate electrode and a source electrode, where the second gate electrode extends into a cavity of the substrate.

Aspect 20: The apparatus of aspect 19, where the second gate electrode includes a first portion that extends into the cavity of the substrate and a second portion that asymmetrically overlays an opening of the cavity of the substrate, the asymmetrical distance based at least in part on the second portion asymmetrically overlaying the opening of the cavity of the substrate.

Aspect 21: The apparatus of aspect 20, where a first distance between the second portion and the drain electrode is less than a second distance between the second portion and the source electrode, the asymmetrical distance based at least in part on the first distance being less than the second distance.

Aspect 22: The apparatus of any of aspects 19 through 21, where the second transistor includes: a first spacer between the second gate electrode and the drain electrode; and a second spacer between the second gate electrode and the source electrode, where a length of the first spacer in a first direction is greater than a length of the second spacer in the first direction, where the asymmetrical distance is based at least in part on the length of the first spacer being greater than the length of the second spacer.

Aspect 23: The apparatus of any of aspects 19, 21, and 22, where the second gate electrode is located closer to the source electrode than the drain electrode, the asymmetrical distance based at least in part on the second gate electrode being located closer to the source electrode.

Aspect 24: The apparatus of any of aspects 19 through 23, where the second gate electrode includes: a first portion extending into the cavity of the substrate and formed above a gate insulation portion extending into the cavity of the substrate, the first portion having a first sidewall and a second sidewall that contact one or more sidewalls of the gate insulation portion, the one or more sidewalls of the gate insulation portion contacting one or more sidewalls of the cavity of the substrate, the first sidewall closer to the drain electrode than the source electrode, and the second sidewall closer to the source electrode than the drain electrode; and a second portion overlaying an opening of the cavity of the substrate, the second portion having a third sidewall and a fourth sidewall, the third sidewall closer to the drain electrode than the source electrode and the fourth sidewall closer to the source electrode than the drain electrode, where a first distance between the first sidewall and the third sidewall is greater than a second distance between the second sidewall and the fourth sidewall, the asymmetrical distance based at least in part on the first distance being greater than the second distance.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a decoder circuit coupled with a conductive line and comprising a pair of transistors configured to bias the conductive line to one or more voltages, the pair of transistors comprising:
a first transistor coupled with the conductive line and a first voltage source, the first transistor comprising a first gate electrode having a first length and formed on a substrate; and
a second transistor coupled with the conductive line and a second voltage source, the second transistor comprising a second gate electrode having a second length and extending into a cavity of the substrate, wherein the second length of the second gate electrode is less than the first length of the first gate electrode.

2. The apparatus of claim 1, wherein the second gate electrode comprises a first portion that extends into the cavity of the substrate and a second portion that asymmetrically overlays an opening of the cavity of the substrate.

3. The apparatus of claim 2, wherein a first distance between the second portion and a drain electrode of the second transistor is less than a second distance between the second portion and a source electrode of the second transistor.

4. The apparatus of claim 1, wherein the second transistor comprises:
a first spacer between the second gate electrode and a drain electrode of the second transistor; and
a second spacer between the second gate electrode and a source electrode of the second transistor, wherein a length of the first spacer in a first direction is greater than a length of the second spacer in the first direction.

5. The apparatus of claim 1, wherein the second gate electrode is located closer to a source electrode of the second transistor than to a drain electrode of the second transistor.

6. The apparatus of claim 1, wherein a length of the first transistor is greater than a length of the second transistor based at least in part on the second length of the second gate electrode being less than the first length of the first gate electrode.

7. The apparatus of claim 1, wherein the second voltage source is a ground voltage.

8. The apparatus of claim 1, wherein:
the first transistor comprises a planar transistor; and
the second transistor comprises a trench transistor.

9. An apparatus, comprising:
an array of memory cells comprising one or more memory cells and an access line coupled with the one or more memory cells;
a decoder circuit coupled with the array of memory cells and comprising a pair of transistors configured to bias the access line to one or more voltages, the pair of transistors comprising:
a first transistor coupled with the access line and a first voltage source, the first transistor comprising a first gate electrode having a first length and formed on a substrate; and
a second transistor coupled with the access line and a second voltage source, the second transistor comprising a second gate electrode having a second length and extending into a cavity of the substrate, wherein the second length of the second gate electrode is different than the first length of the first gate electrode.

10. The apparatus of claim 9, wherein the second gate electrode comprises a first portion that extends into the cavity of the substrate and a second portion that asymmetrically overlays an opening of the cavity of the substrate.

11. The apparatus of claim 10, wherein a first distance between the second portion and a drain electrode of the second transistor is less than a second distance between the second portion and a source electrode of the second transistor.

12. The apparatus of claim 9, wherein the second transistor comprises:
a first spacer between the second gate electrode and a drain electrode; and
a second spacer between the second gate electrode and a source electrode, wherein a length of the first spacer in a first direction is greater than a length of the second spacer in the first direction.

13. The apparatus of claim 9, wherein the second gate electrode is located closer to a source electrode of the second transistor than a drain electrode of the second transistor.

14. The apparatus of claim 9, further comprising:
a second decoder circuit coupled with the array of memory cells and comprising a second pair of transistors configured to bias a second access line to one or more second voltages, the second pair of transistors comprising:
a third transistor coupled with the second access line and a third voltage source, the third transistor comprising a third gate electrode having a third length and formed on the substrate; and
a fourth transistor coupled with the second access line and a fourth voltage source, the fourth transistor comprising a fourth gate electrode having a fourth length and extending into a second cavity of the substrate, wherein the fourth length of the fourth gate electrode is less than the third length of the third gate electrode.

15. The apparatus of claim 14, wherein the fourth gate electrode comprises a first portion that extends into the second cavity of the substrate and a second portion that asymmetrically overlays the second cavity of the substrate.

16. The apparatus of claim 14, wherein the fourth transistor comprises:
a first spacer between the fourth gate electrode and a drain electrode of the fourth transistor; and
a second spacer between the fourth gate electrode and a source electrode of the fourth transistor, wherein a length of the first spacer in a first direction is greater than a length of the second spacer in the first direction.

17. The apparatus of claim 14, wherein the fourth gate electrode is located closer to a source electrode of the fourth transistor than a drain electrode of the fourth transistor.

18. The apparatus of claim 14, wherein the first voltage source is a positive voltage source, the third voltage source is a negative voltage source, and the second voltage source and the fourth voltage source are ground voltage sources.

19. An apparatus, comprising:
a decoder circuit coupled with a conductive line and comprising a pair of transistors configured to bias the conductive line to one or more voltages, the pair of transistors comprising:
a first transistor coupled with the conductive line and a first voltage source, the first transistor comprising a first gate electrode formed on a substrate; and
a second transistor coupled with the conductive line and a second voltage source, the second transistor having an asymmetrical distance between a second gate electrode and a drain electrode and between the second gate electrode and a source electrode, wherein the second gate electrode extends into a cavity of the substrate.

20. The apparatus of claim 19, wherein the second gate electrode comprises a first portion that extends into the cavity of the substrate and a second portion that asymmetrically overlays an opening of the cavity of the substrate, the asymmetrical distance based at least in part on the second portion asymmetrically overlaying the opening of the cavity of the substrate.

21. The apparatus of claim 20, wherein a first distance between the second portion and the drain electrode is less than a second distance between the second portion and the source electrode, the asymmetrical distance based at least in part on the first distance being less than the second distance.

22. The apparatus of claim 19, wherein the second transistor comprises:
- a first spacer between the second gate electrode and the drain electrode; and
- a second spacer between the second gate electrode and the source electrode, wherein a length of the first spacer in a first direction is greater than a length of the second spacer in the first direction, wherein the asymmetrical distance is based at least in part on the length of the first spacer being greater than the length of the second spacer.

23. The apparatus of claim 19, wherein the second gate electrode is located closer to the source electrode than the drain electrode, the asymmetrical distance based at least in part on the second gate electrode being located closer to the source electrode.

24. The apparatus of claim 19, wherein the second gate electrode comprises:
- a first portion extending into the cavity of the substrate and formed above a gate insulation portion extending into the cavity of the substrate, the first portion having a first sidewall and a second sidewall that contact one or more sidewalls of the gate insulation portion, the one or more sidewalls of the gate insulation portion contacting one or more sidewalls of the cavity of the substrate, the first sidewall closer to the drain electrode than the source electrode, and the second sidewall closer to the source electrode than the drain electrode; and
- a second portion overlaying an opening of the cavity of the substrate, the second portion having a third sidewall and a fourth sidewall, the third sidewall closer to the drain electrode than the source electrode and the fourth sidewall closer to the source electrode than the drain electrode,
- wherein a first distance between the first sidewall and the third sidewall is greater than a second distance between the second sidewall and the fourth sidewall, the asymmetrical distance based at least in part on the first distance being greater than the second distance.

* * * * *